United States Patent [19]
Wiemer

[11] Patent Number: 5,117,300
[45] Date of Patent: May 26, 1992

[54] ELECTRICAL CIRCUIT DEVICE WITH DIFFERENT TYPES OF CONSUCTOR PATHS

[75] Inventor: Wolfram Wiemer, Blaustein, Fed. Rep. of Germany

[73] Assignee: Licentia Patent-Verwaltungs-GmbH, Frankfurt, Fed. Rep. of Germany

[21] Appl. No.: 501,042

[22] Filed: Mar. 29, 1990

[30] Foreign Application Priority Data

Apr. 5, 1989 [DE] Fed. Rep. of Germany ....... 3910963

[51] Int. Cl.⁵ .............................................. G02F 1/13
[52] U.S. Cl. ........................................ 359/88; 359/87; 359/89; 359/74
[58] Field of Search ................... 350/336, 332, 331 R, 350/339 R, 334

[56] References Cited

U.S. PATENT DOCUMENTS

| | | | |
|---|---|---|---|
| 4,008,564 | 2/1977 | Luce et al. | 350/332 |
| 4,145,120 | 3/1979 | Kubota | 350/332 |
| 4,545,647 | 10/1985 | Sasaki et al. | 350/336 |
| 4,586,789 | 5/1986 | Kishimoto et al. | 350/336 |
| 4,629,289 | 12/1986 | Streit | 350/336 |
| 4,643,526 | 2/1987 | Watanabe et al. | 350/339 R |
| 4,687,300 | 8/1987 | Kubo et al. | 350/336 |
| 4,746,198 | 5/1988 | Baeger | 350/332 |
| 4,826,297 | 5/1989 | Kubo et al. | 350/331 R |
| 4,917,466 | 4/1990 | Nakamura et al. | 350/339 R |

FOREIGN PATENT DOCUMENTS

| | | | |
|---|---|---|---|
| 3426715 | 1/1986 | Fed. Rep. of Germany . | |
| 0073693 | 6/1977 | Japan | 350/336 |
| 0021027 | 2/1985 | Japan | 350/331 R |
| 0129729 | 7/1985 | Japan | 350/331 R |
| 2151834 | 7/1985 | United Kingdom . | |
| 2160693 | 12/1985 | United Kingdom . | |
| 2166899 | 5/1986 | United Kingdom . | |

OTHER PUBLICATIONS

Feinwerktecktechnik & Messtechnik, Band 94, No. 4, May, 1986, pp. 251-152,, Carl Hanser Verlag, München, 1986.
E. Weise et al. "Elektrische und Mechanische Verbindung von Flüssigkristall-Anzeigen(LCD) und Treiberbausteinen".
TE-Toute L'Electronique, No. 534, May, 1988, pp. 18-23, Paris, FR; "TV Couleur: Technique des écrans á Cristaux Liquides".
Patent Abstract of Japan, Band 13, No. 47 (P-822), Feb. 3, 1989; JP-A-63241523 (Toshiba).

*Primary Examiner*—Rolf Hille
*Assistant Examiner*—Tan Ho
*Attorney, Agent, or Firm*—Spencer, Frank & Schneider

[57] ABSTRACT

An electrical device including a glass substrate, an intrgrated circuit chip, an electrical device and electrical conductor paths applied to the surface of the glass substrate and connected to electrical terminals of the integrated circuit chip and the electrical device. The conductor paths are divided into supply conductor paths for supplying voltage to the integrated circuit chip and actuation conductor paths for actuating the electronic device. The actuation conductor paths are composed of layers of indium tin oxide deposited on the glass surface and the supply conductor paths are composed of metal films glued on the glass surface.

10 Claims, 1 Drawing Sheet

ELECTRICAL CIRCUIT DEVICE WITH DIFFERENT TYPES OF CONSUCTOR PATHS

CROSS-REFERENCES TO RELATED APPLICATIONS

This application claims the priority of Federal Republic of Germany Application No. P 39 10 963 filed Apr. 5, 1989, which is incorporated herein by reference.

BACKGROUND OF THE INVENTION

The present invention relates to an electrical circuit device including an integrated circuit (IC) chip and an electrical device, such as a liquid crystal display mounted on a glass substrate, and conductor paths on the substrate connected to the terminals of the IC chip and the electrical device.

In circuit arrangements of the above type, the IC chip actuates liquid crystal display cells. The glass substrate equipped with the circuit arrangement is one of two cover plates surrounding the liquid crystal cell. The technique of applying actuating integrated circuits chips (IC's) directly onto the glass plates of liquid crystal cells is known as the Chip On Glass (COG) technique. It is known in this connection, to apply electrical conductor paths on the glass substrate of a liquid crystal cell. In particular, the conductor paths are applied directly onto the glass surface of the substrate in the form of indium tin oxide paths (ITO paths) or as metallization layers.

While ITO paths are well suited as electrodes and electrode leads for liquid crystal cells, the lower conductivity of these ITO layers has a disturbing effect if these conductor paths are to supply several IC's with power. Therefore, electrical conductor paths supplying power (supply lines) have also been configured as metallization paths on the glass surface. However, this technique requires many additional processing steps which, not only because of chemical side-effects, bring about the risk of malfunctions.

SUMMARY OF THE INVENTION

It is an object of the present invention to improve a circuit arrangement of an electrical device which is particularly suited for liquid crystal display devices so that, in a simple manufacturing process, different types of conductor paths are provided.

This is accomplished by the present invention which provides an electrical device including a glass substrate, an integrated circuit chip, an electrical device and electrical conductor paths applied to the surface of the glass substrate and connected with electrical terminals of the integrated circuit chip and the electrical device, wherein the conductor paths are divided into supply conductor paths for supplying voltage to the integrated circuit chip and actuation conductor paths for actuating the electronic device disposed on the same surface of the glass substrate as the integrated circuit chip, and the actuation conductor paths are composed of layers of indium tin oxide deposited on the glass surface and the supply conductor paths are composed of metal films glued on the glass surface.

A significant advantage of the invention is that the production of such circuit arrangements with different conductor paths is simplified. Another advantage is that the application of the supply conductor path lines does not require disturbingly high temperatures and has no adverse chemical effect on existing paths and arrangements.

BRIEF DESCRIPTION OF THE DRAWINGS

The invention will now be described in detail with reference to the accompanying drawings in which.

DESCRIPTION OF THE PREFERRED EMBODIMENTS

Figure 1:
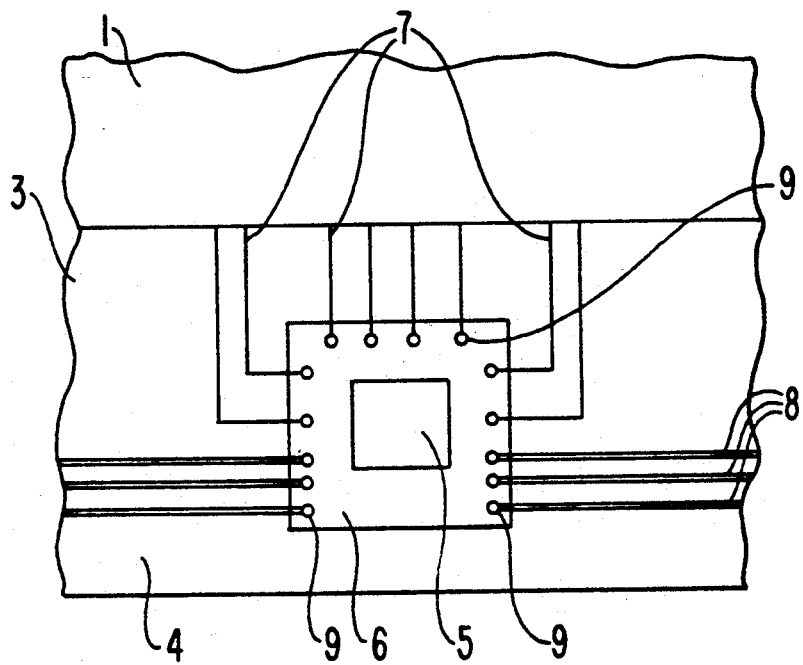
FIG. 1 is a schematic top view of a section of a liquid crystal display device according to a preferred embodiment of the invention.
Figure 2:
FIG. 2 is a schematic side view of a liquid crystal display device provided with a circuit arrangement according to the invention.

Referring to the figures, a liquid crystal device, according to the invention, includes two glass cover plates 1 and 3 between which a liquid crystal layer 2 is disposed in a known manner. One cover plate 3 is larger than the other cover plate 1 and serves as a substrate. Substrate 3 has a surface 4, which projects beyond cover plate 1, on which there is disposed an integrated circuit chip (IC) 5 and its associated circuitry, as shown in FIG. 1 which is a top view of a section of a liquid crystal display device according to the invention.

On glass surface 4 of the part of cover plate or substrate 3 which projects beyond cover plate 1, there are disposed conductor paths 7 and 8 in the form of leads to the driver IC 5.

Conductor paths 7 serve to supply actuation signals from IC 5 to the electrodes arranged in the liquid crystal cell in the customary manner so that the liquid crystal layer can be changed with respect to its light transmissibility in desired partial regions.

Actuation conductor paths 7 extend into the interior of the liquid crystal cell and each path is composed of an ITO (indium tin oxide) layer which is deposited in a known manner on glass surface 4. Such ITO layers are very thin and are suitable only to conduct relatively small currents. The electrodes in the interior of the liquid crystal cell are customarily likewise composed of such ITO layers.

The supply voltage and signals for IC 5 are introduced through supply conductor paths or lines 8 applied to glass surface 4. Particularly if several IC's are present, comparatively stronger currents are able to flow in these supply lines. The present invention now provides that, in contrast to actuating conductor paths 7, these supply conductor paths 8 are made of metal films which are glued directly or indirectly onto glass surface 4.

In the case where supply lines 8 are glued directly onto glass surface 4, the conductor paths 8 are composed of metal foils glued to glass surface 4. According to a preferred embodiment, these conductor paths 8 are composed of metal layers applied on a plastic tape. The plastic tape carrying the metal-layer paths is glued onto glass surface 4 effecting the indirect attachment of conductor paths 8 to glass surface 4.

The electrical connection between the electrical terminals of IC 5 and conductor paths 8 can be provided by electrical contacts composed of an electrically conductive adhesive. The electrical contacts are disposed at the junction where conductor paths 8 meet the terminals of IC 5. An anisotropic fusion adhesive or hot-melting adhesive, is particularly suitable for the electrical contacts.

The IC 5 can be directly attached to the glass substrate 4, or, can be indirectly attached as shown in FIG. 1. According to the preferred embodiment, the application of IC 5 to glass substrate 3 is effected indirectly with the use of a conventional tape automatic bonding process (TAB). In this process, IC 5 is disposed on a plastic sheet 6 provided with conductor paths, e.g. of copper, (not shown) which are already connected to the terminals of IC 5. In the indirect TAB technique, these conductor paths on sheet 6 are electrically connected via electrical contacts 9 to conductor paths 7 and 8 disposed on the glass substrate. In this case as well, the gluing of plastic sheet 6 is advisably effected by means of an anisotropic hot-melting adhesive.

According to a further embodiment, the electrical conductive connections of IC 5 with actuating lines 7 are effected by means of an anisotropic conductive adhesive, particularly a hot-melting adhesive; and the electrical connections of IC 5 with supply lines 8 are applied by means of soldering.

While the invention has been described with reference to preferred specific embodiments, it will be understood that this description is intended to illustrate and not limit the scope of the invention, which is defined by the following claims.

I claim:

1. An electrical circuit device, including: a glass substrate having a surface; an integrated circuit chip with electrical terminals; an electrical device with electrical terminals and disposed on the same surface of the glass substrate as the integrated circuit chip; and electrical conductor paths applied to the surface of the glass substrate and connected to the electrical terminals of the integrated circuit chip and the electrical device, wherein said conductor paths include supply conductor paths connected to the terminals of the integrated circuit chip for supplying voltage to the integrated circuit chip and actuation conductor paths connected between the terminals of the integrated circuit chip and the electrical device for actuating the electrical device, and said actuation conductor paths comprise layers of indium tin oxide deposited on the surface of the glass substrate and said supply conductor paths comprise metal films glued on the surface of the glass substrate.

2. An electrical circuit device as defined in claim 1, further comprising an anisotropic conductive adhesive electrically connecting the electrical terminals of the integrated circuit chip to said actuation conductor paths.

3. An electrical circuit device, as defined in claim 2, wherein said anisotropic conductive adhesive comprises a hot-melting adhesive.

4. An electrical circuit device as defined in claim 1, further comprising an anisotropic conductive adhesive electrically connecting the electrical terminals of the integrated circuit chip to said supply conductor paths.

5. An electrical circuit device as defined in claim 4, wherein said anisotropic conductive adhesive comprises a hot-melting adhesive.

6. An electrical circuit device as defined in claim 1, further comprising an anisotropic adhesive for electrically connecting the electrical terminals of the integrated circuit chip to said actuating conductor paths, and wherein the electrical connection between said supply conductor paths and electrical terminals of the integrated circuit chip comprises a solder connection.

7. An electrical circuit device as defined in claim 1, further comprising a plastic sheet including conductor paths and disposed on the glass substrate, wherein the integrated circuit chip is pre-mounted on said plastic sheet and the conductor paths of said plastic sheet are electrically connected to said actuation and supply conductor paths on the surface of the glass substrate.

8. An electrical circuit device as defined in claim 1, wherein said electrical device comprises a liquid crystal cell and further including a glass cover cooperating with said glass substrate enclosing said liquid crystal cell to form a liquid crystal display device.

9. An electrical circuit device as defined in claim 1, wherein said supply conductor paths comprise metal foil paths glued onto the glass surface.

10. A circuit arrangement as defined in claim 1, and further comprising a plastic sheet, wherein said supply conductor paths comprise metallization paths applied to said plastic sheet, and said plastic sheet carrying the metallization paths is glued to the glass surface.

* * * * *